United States Patent
Satou et al.

(10) Patent No.: US 12,048,104 B2
(45) Date of Patent: Jul. 23, 2024

(54) STRUCTURE FOR CONNECTING TERMINAL TO CIRCUIT SUBSTRATE WITHIN CASE

(71) Applicant: MINEBEA ACCESSSOLUTIONS INC., Miyazaki (JP)

(72) Inventors: Yuuichi Satou, Miyazaki (JP); Minoru Shibutani, Miyazaki (JP); Hiroyuki Hazawa, Tokyo (JP); Shinichi Ozaki, Tokyo (JP); Yoshiyuki Miyakawa, Tokyo (JP); Yoshihiro Yamazumi, Tokyo (JP)

(73) Assignee: Minebea AccessSolutions Inc., Miyazaki (JP)

( * ) Notice: Subject to any disclaimer, the term of this patent is extended or adjusted under 35 U.S.C. 154(b) by 265 days.

(21) Appl. No.: 17/306,344

(22) Filed: May 3, 2021

(65) Prior Publication Data

US 2021/0378112 A1 Dec. 2, 2021

(30) Foreign Application Priority Data

May 26, 2020 (JP) ................. 2020-091277

(51) Int. Cl.
*H01R 12/58* (2011.01)
*H05K 5/00* (2006.01)
(52) U.S. Cl.
CPC ......... *H05K 5/0069* (2013.01); *H05K 5/0056* (2013.01); *H01R 12/58* (2013.01)
(58) Field of Classification Search
CPC ................. H01R 12/50; H01R 12/58

(Continued)

(56) References Cited

U.S. PATENT DOCUMENTS 4,047,242 A * 9/1977 Jakob ............... H05K 7/1417
439/55
4,729,740 A * 3/1988 Crowe ............. H01R 13/6633
361/674

(Continued)

FOREIGN PATENT DOCUMENTS

JP 2012-195067 A 10/2012
JP 2013-168315 A 8/2013

(Continued)

OTHER PUBLICATIONS

Decision to Grant a Patent dated Apr. 13, 2022 in the corresponding Japanese Patent Application 2020-091277 with the English machine translation thereof.

*Primary Examiner* — Harshad C Patel
(74) *Attorney, Agent, or Firm* — Carrier, Shende & Associates P.C.; Joseph P. Carrier; Jeffrey T. Gedeon

(57) ABSTRACT

In a structure for connecting a terminal to a circuit substrate within a case, a resin holder to which a plurality of terminal members are insert bonded is insert bonded to a resin case member having a connector portion and configuring part of the case. Each terminal member has one end part connected to the circuit substrate housed in the case, another end part of the terminal member being disposed within the connector portion. The holder is insert bonded to the case member while leaving an exposure hole as a cavity. Formed in the case member is an open hole communicating with the exposure hole and opening on a housing chamber side. Accordingly, it is possible to prevent a short circuit due to moisture from occurring between the terminal members retained by the holder.

5 Claims, 13 Drawing Sheets

(58) Field of Classification Search
USPC ........................................................ 439/76.1
See application file for complete search history.

(56) References Cited

U.S. PATENT DOCUMENTS

| | | | | |
|---|---|---|---|---|
| 5,006,764 | A * | 4/1991 | Swanson | H05B 41/02 361/674 |
| 6,511,331 | B2 * | 1/2003 | Saito | B60R 16/0238 439/949 |
| 6,590,777 | B2 * | 7/2003 | Morino | H01H 35/24 361/736 |
| 6,677,521 | B2 * | 1/2004 | Sumida | H05K 7/026 174/541 |
| 6,736,676 | B2 * | 5/2004 | Zhang | H01R 12/727 439/607.22 |
| 6,891,463 | B2 * | 5/2005 | Nagaoka | H05K 3/301 337/198 |
| 6,969,280 | B2 * | 11/2005 | Chien | H01R 13/6587 439/607.13 |
| 7,070,446 | B2 * | 7/2006 | Henry | H01R 13/6594 439/541.5 |
| 7,074,053 | B2 * | 7/2006 | Kawakita | H01R 13/6658 174/541 |
| 7,249,966 | B2 * | 7/2007 | Long | H01R 13/659 439/490 |
| 7,408,765 | B2 * | 8/2008 | Kanou | H05K 7/026 361/624 |
| 7,422,483 | B2 * | 9/2008 | Avery | H01R 13/6587 439/607.05 |
| 7,514,629 | B2 * | 4/2009 | Sasaki | H02G 3/086 361/752 |
| 7,599,189 | B2 * | 10/2009 | Nishimoto | H05K 5/0047 361/752 |
| 7,753,710 | B2 * | 7/2010 | George | H01R 13/635 439/352 |
| 7,824,187 | B1 * | 11/2010 | Yi | H01R 12/737 439/65 |
| 7,857,637 | B2 * | 12/2010 | Kasai | H01R 12/724 439/76.2 |
| 7,950,931 | B2 * | 5/2011 | Nakanishi | H02G 3/088 439/76.2 |
| 8,070,535 | B2 * | 12/2011 | Goto | H05K 3/308 439/876 |
| 8,267,726 | B1 * | 9/2012 | Love, II | H04Q 1/09 439/668 |
| 8,342,880 | B2 * | 1/2013 | Kato | H01R 13/4226 439/382 |
| 8,535,064 | B2 * | 9/2013 | Linton | A61G 10/026 434/372 |
| 8,556,660 | B2 | 10/2013 | Matsuoka et al. | |
| 8,624,122 | B2 * | 1/2014 | Shiraiwa | H05K 1/0206 174/250 |
| 9,722,339 | B2 | 8/2017 | Tamaki et al. | |
| 9,865,412 | B2 | 1/2018 | Satou et al. | |
| 9,966,692 | B2 | 5/2018 | Yamachika et al. | |
| 9,979,134 | B2 * | 5/2018 | Yu | H01R 13/6585 |
| 10,630,010 | B2 * | 4/2020 | Tracy | H01R 12/73 |
| 10,785,882 | B2 * | 9/2020 | Tsujiya | H05K 5/0056 |
| 10,931,060 | B2 * | 2/2021 | Iizuka | H01F 17/06 |
| 10,944,229 | B2 * | 3/2021 | Su | H01R 43/24 |
| 10,944,230 | B2 * | 3/2021 | Ito | H01R 24/00 |
| 2010/0255732 | A1 * | 10/2010 | Kohmura | B29C 45/14311 428/57 |
| 2017/0077652 | A1 | 3/2017 | Chen et al. | |

FOREIGN PATENT DOCUMENTS

| | | |
|---|---|---|
| JP | 2014-143898 A | 8/2014 |
| JP | 2015-210840 A | 11/2015 |
| JP | 2017-191652 A | 10/2017 |
| JP | 6260874 B2 | 1/2018 |
| JP | 2019-204577 A | 11/2019 |

* cited by examiner

STRUCTURE FOR CONNECTING TERMINAL TO CIRCUIT SUBSTRATE WITHIN CASE

BACKGROUND OF THE INVENTION

Field of the Invention

The present invention relates to a structure for connecting a terminal to a circuit substrate within a case, in which a housing chamber is formed within the case having a resin case member integrally having a connector portion, a plurality of terminal members each having one end part connected to the circuit substrate housed in the housing chamber are insert bonded to a resin holder, and the resin holder, which has an exposure hole formed therein through which part of each of the terminal members is exposed, is insert bonded to the case member, another end part of the terminal member being disposed within the connector portion.

Description of the Related Art

A vehicular push-button switch device for releasing latching of a vehicle door such as a tailgate is known from Japanese Patent No. 6260874, and in this arrangement a resin holder to which a plurality of terminal members are insert bonded is insert bonded to a resin case member forming part of a case while having a connector part facing the inside of the vehicle, and the terminal member has one end part connected to a circuit substrate housed within the case and has the other end part disposed within the connector part.

After completion of primary molding in which the plurality of terminal members are insert bonded to the resin holder, an exposure hole for punching out via which a linking part linking the plurality of terminal members to each other is punched out to thus release the linking or an exposure hole for fixing the terminal member in order to prevent the terminal member from being deformed at the time of insert molding is formed in the holder. In the arrangement disclosed by Japanese Patent No. 6260874, at the time of secondary molding in which the holder is insert bonded to the case member, the exposure hole is charged with a secondary molding resin, and a border is formed between the primary molding resin and the secondary molding resin in a portion corresponding to the inside face of the exposure hole. Because of this, if moisture in the air infiltrates through a gap between the terminal member and the primary molding resin from the connector part side facing the inside of the vehicle, the moisture will reach between terminal members adjacent to each other along the border between the primary molding resin and the secondary molding resin in the portion corresponding to the exposure hole, and there is a possibility that a short circuit will occur between the terminal members.

SUMMARY OF THE INVENTION

The present invention has been accomplished in light of such circumstances, and it is an object thereof to provide a structure for connecting a terminal to a circuit substrate within a case, the structure being capable of preventing a short circuit due to moisture from occurring between terminal members retained by a holder.

In order to achieve the object, according to a first aspect of the present invention, there is provided a structure for connecting a terminal to a circuit substrate within a case, in which a housing chamber is formed within the case having a resin case member integrally having a connector portion, a plurality of terminal members each having one end part connected to the circuit substrate housed in the housing chamber are insert bonded to a resin holder, and the resin holder, which has an exposure hole formed therein through which part of each of the terminal members is exposed, is insert bonded to the case member, another end part of the terminal member being disposed within the connector portion, wherein the holder is insert bonded to the case member while leaving the exposure hole as a cavity, and the case member has an open hole formed therein, the open hole communicating with the exposure hole and opening on the housing chamber side.

In accordance with the first aspect of the present invention, the exposure hole of the holder remains as a cavity after the holder is insert bonded to the case member, no border occurs in a portion corresponding to the inside face of the exposure hole between a primary molding resin forming the holder and a secondary molding resin forming the case member and, therefore, even if moisture in the air enters a gap between the terminal member and the primary molding resin from the connector portion, no short circuit is caused by the moisture between the terminal members in the portion of the exposure hole.

According to a second aspect of the present invention, in addition to the first aspect, the exposure hole is formed in the holder at a position where a portion, other than opposite end parts, of the terminal member faces the exposure hole.

In accordance with the second aspect of the present invention, it is possible to decrease as much as possible the area of the exposure hole formed in the holder, thus minimizing a portion, which forms the exposure hole, of a mold forming the holder and thereby reducing the cost of the mold.

According to a third aspect of the present invention, in addition to the first or second aspect, a communication hole is formed in the case member, the communication hole providing communication between the housing chamber and an outside of the case member.

In accordance with the third aspect of the present invention, it is possible for the communication hole formed in the case member to prevent any difference from occurring between the pressure of the outside of the case member and the pressure within the housing chamber. Because of this, even if moisture in the air enters the exposure hole side from the connector portion through the gap between the terminal member and the primary molding resin, it is possible to suppress moisture being sucked toward the housing chamber side. That is, if the interior of the housing chamber were a space independent from the outside, due to the pressure within the housing chamber becoming lower when the temperature is low, moisture entering the exposure hole would be sucked into the housing chamber and could drip down, but due to the communication hole being formed in the case member such an event can be avoided.

The above and other objects, characteristics and advantages of the present invention will be clear from detailed descriptions of the preferred embodiment which will be provided below while referring to the attached drawings.

DESCRIPTION OF THE PREFERRED EMBODIMENT

Figure 1:
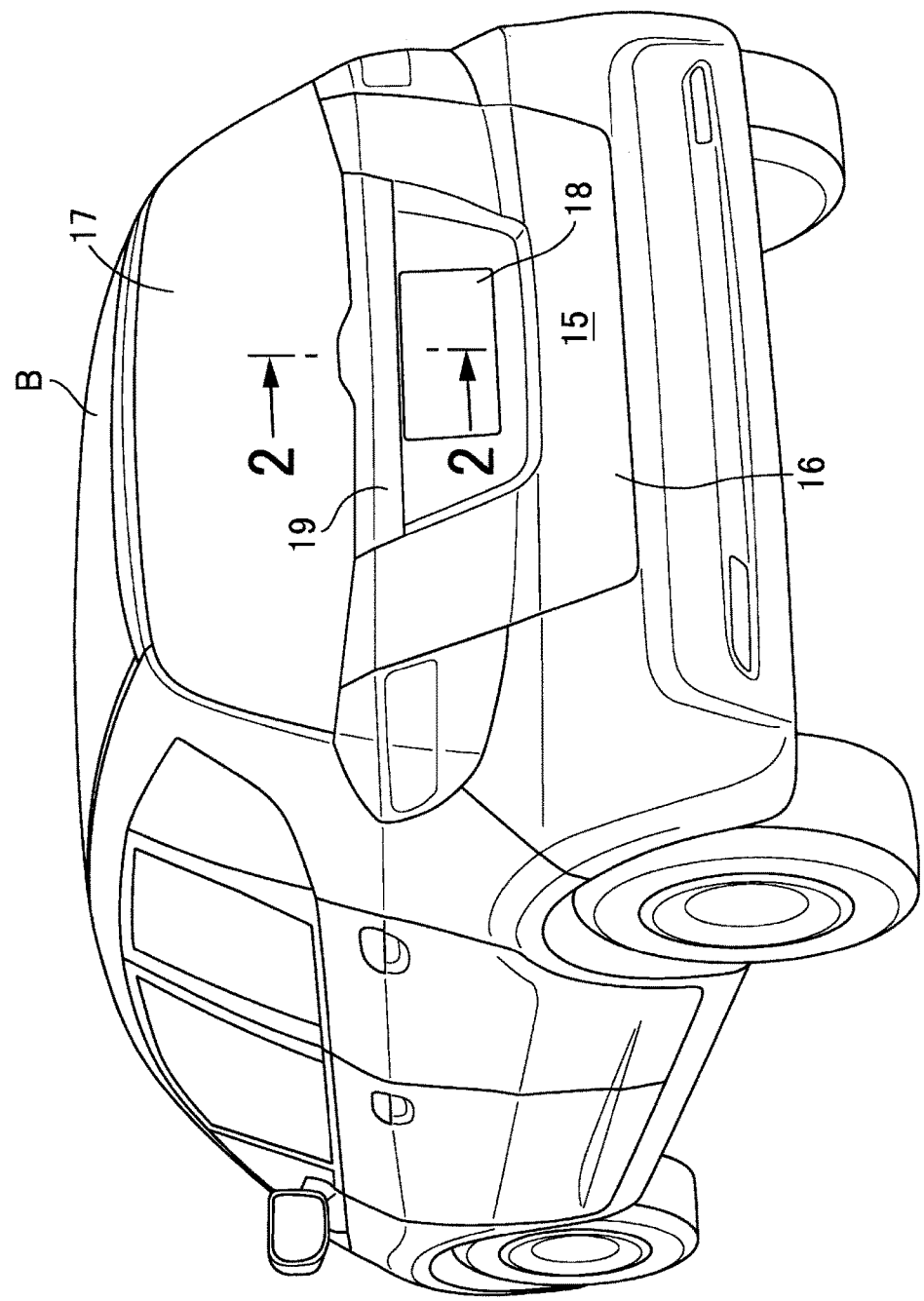
FIG. 1 is a perspective view when a vehicle is viewed from the rear.

An embodiment of the present invention is explained by reference to the attached FIG. 1 to FIG. 13. First, in FIG. 1, a tailgate 15 as a lid is mounted on a rear part of a vehicle body B of a passenger vehicle so that it can be opened upward and can be closed, and a rear window 17 is provided in an upper part of the tailgate 15. A decorative cover 19 is fixed to a middle part in the width direction of an outer panel 16 of the tailgate 15 so as to be disposed beneath the rear window 17, and a license plate 18 is fixed to a middle part in the width direction of the outer panel 16 so as to be disposed beneath the decorative cover 19.

Figure 2:
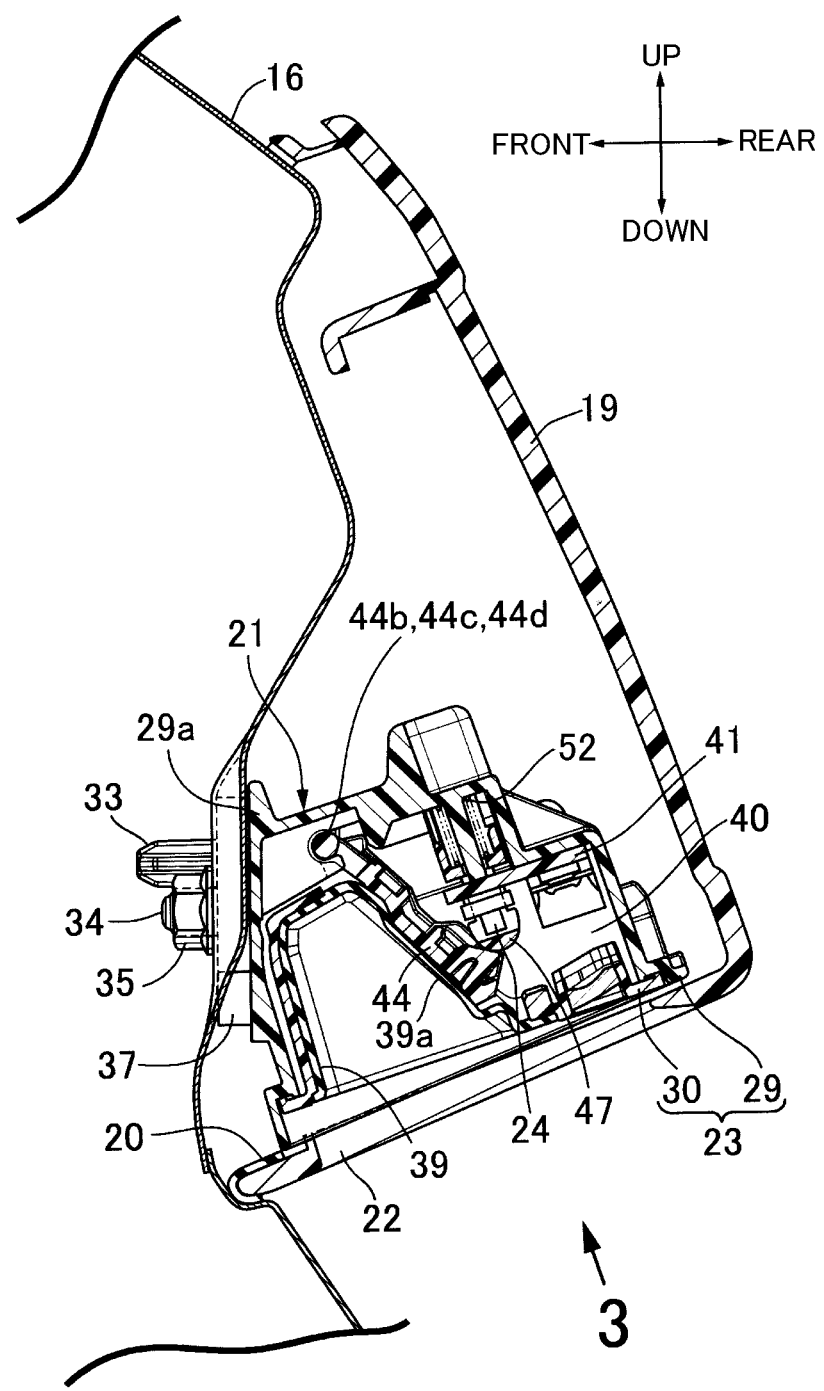
FIG. 2 is an enlarged sectional view along line 2-2 in FIG. 1.
Figure 3:
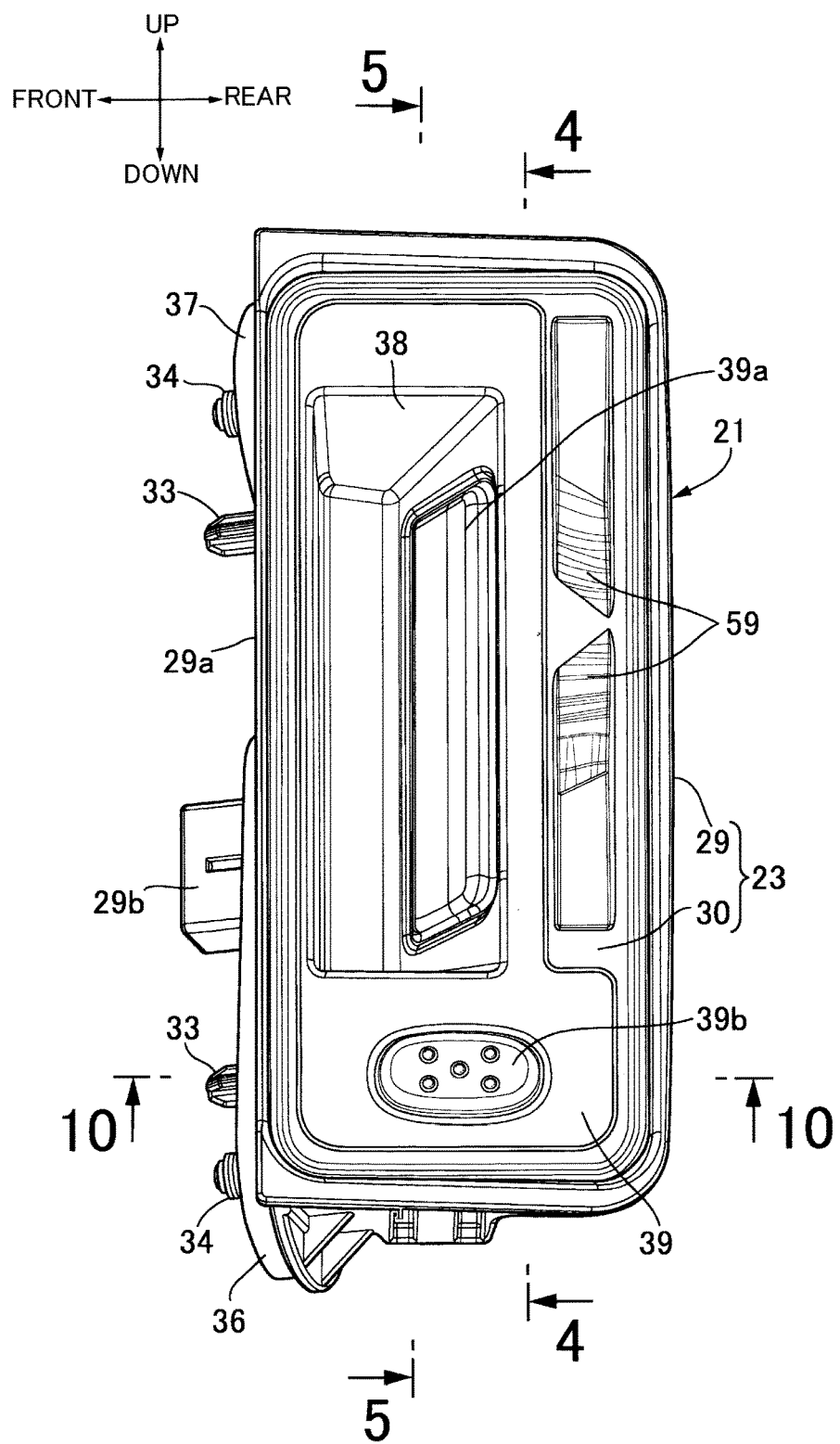
FIG. 3 is a perspective view from the direction of arrow 3 in FIG. 2 in a state in which a tailgate and a decorative cover are omitted.
Figure 4:
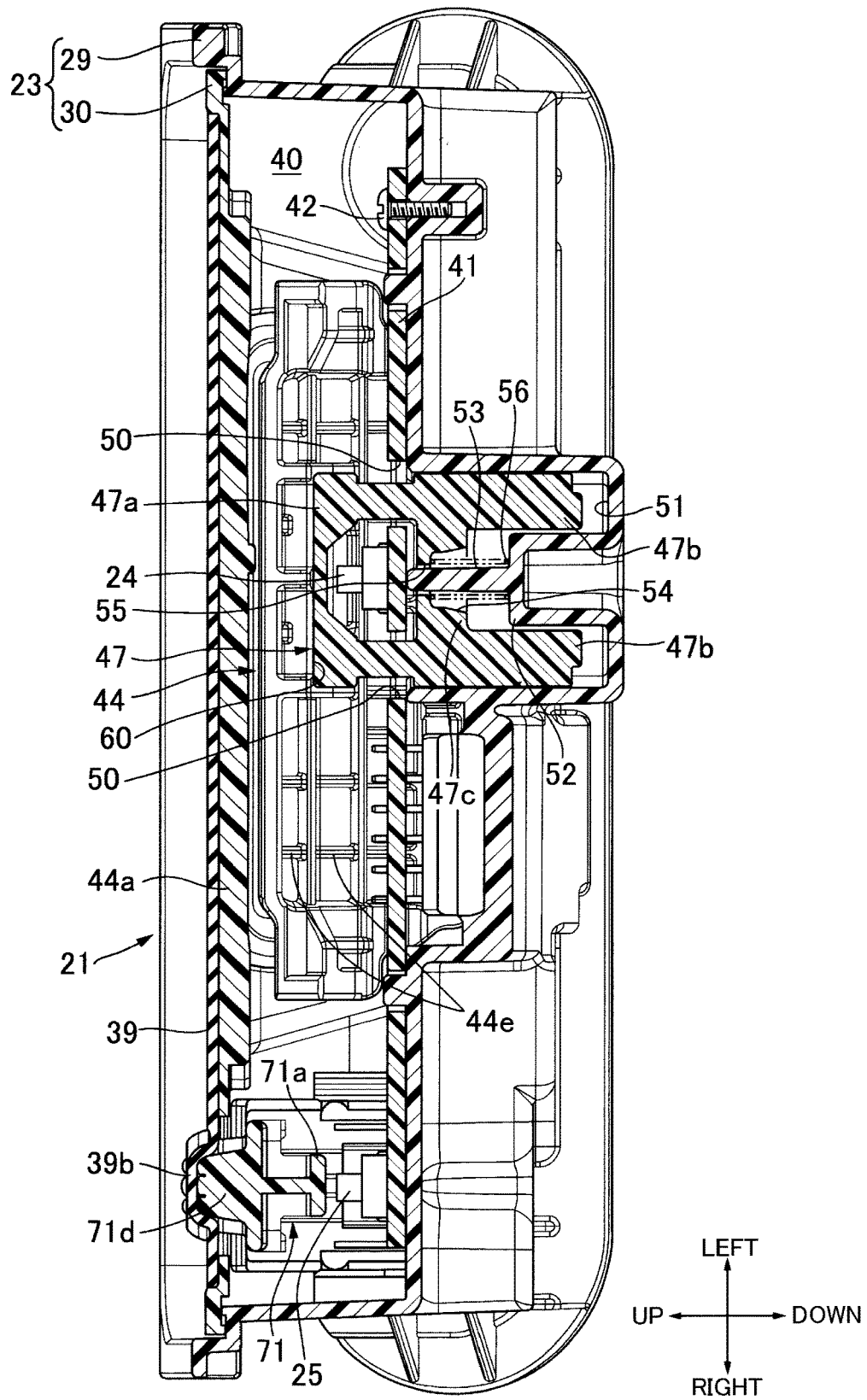
FIG. 4 is a sectional view along line 4-4 in FIG. 3.
Figure 5:
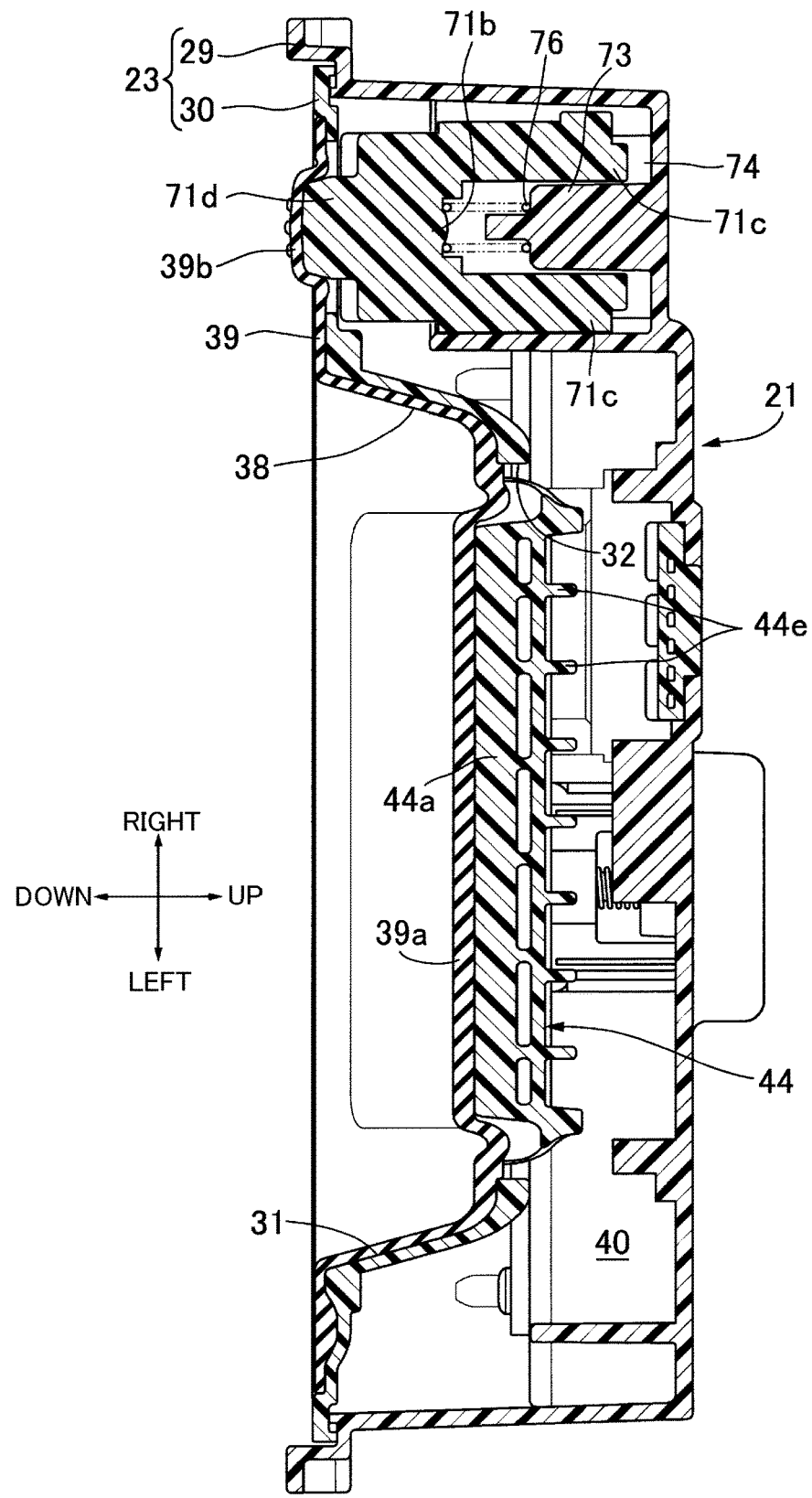
FIG. 5 is a sectional view along line 5-5 in FIG. 3.

In FIG. 2, the decorative cover 19 is formed so as to bulge to the rear of the vehicle from the tailgate 15 while opening toward the tailgate 15 side and is fixed to the outer panel 16 of the tailgate 15, and an endlessly continuous first seal member 20 is disposed between the outer panel 16 and an opening edge, on the tailgate 15 side, of the decorative cover 19.

A structure for connecting a terminal to a circuit substrate within a case is applied to a vehicular push-button switch device 21 in this embodiment, the vehicular push-button switch device 21 being mounted on the tailgate 15 so as to be housed within the decorative cover 19. In this embodiment, the vehicular push-button switch device 21 can make all the doors other than the tailgate 15 switch between a locked state and an unlocked state and can make the tailgate 15 switch from a latched state to an unlatched state, and an operation opening 22 for operating the vehicular push-button switch device 21 is provided in a bottom part of the decorative cover 19.

Referring in addition to FIG. 3 to FIG. 6, the vehicular push-button switch device 21 includes a case 23 fixed to the outer panel 16 and first and second switches 24, 25 fixedly disposed within the case 23, these switches 24, 25 being tact switches in this embodiment.

The first switch 24 is for putting all the doors other than the tailgate 15 in the unlocked state and putting the tailgate 15 in the unlatched state; when the legitimacy of a vehicle user is confirmed by bidirectional communication between the vehicle and a portable apparatus carried by the user in a state in which the switching mode of the first switch 24 is changed by a pushing operation, all the doors other than the tailgate 15 are put into the unlocked state and only the tailgate 15 is automatically put into the unlatched state by means of an electric drive and attains an open state. In addition, the arrangement may be such that all the doors other than the tailgate 15 are put into the unlocked state and only the tailgate 15 is put into the unlatched state by changing the switching mode of the first switch 24 after the legitimacy of a user is confirmed in advance.

The second switch 25 is for putting all the doors other than the tailgate 15 in the locked state; when the legitimacy of a vehicle user is confirmed by bidirectional communication between the vehicle and a portable apparatus carried by the user in a state in which the switching mode of the second switch 25 is changed by a pushing operation, all the doors other than the tailgate 15 are put into a locked state. In addition, the arrangement may be such that all the doors other than the tailgate 15 are put into the locked state by changing the switching mode of the second switch 25 after the legitimacy of a user is confirmed in advance. The reason why the vehicular push-button switch device 21 provided in the tailgate 15 is thus equipped with the second switch 25 in order to put all the doors other than the tailgate 15 into the locked state is to eliminate the inconvenience of going to a driver's seat-side door so as to push a lock switch provided thereon in order to lock another door after closing the tailgate 15.

The case 23 is formed by joining first and second case members 29, 30 that are each formed from a synthetic resin, and a flat mounting plate portion 29a formed on the first case member 29 is mounted on the outer panel 16. Moreover, the first case member 29 is formed into a bowl shape opening downward when the tailgate 15 having the case 23 mounted thereon is in a closed state. On the other hand, the second case member 30 is joined to a lower open edge of the first case member 29 so as to block part of the lower open end of the first case member 29. The second case member 30 has a first recess part 31 that is recessed so as to protrude into the first case member 29 while enabling a user to insert their hand from the operation opening 22 of the decorative cover 19, and an opening 32 is formed in a portion of the first recess part 31 that is at a rear position when the tailgate 15 is in the closed state.

Figure 7:
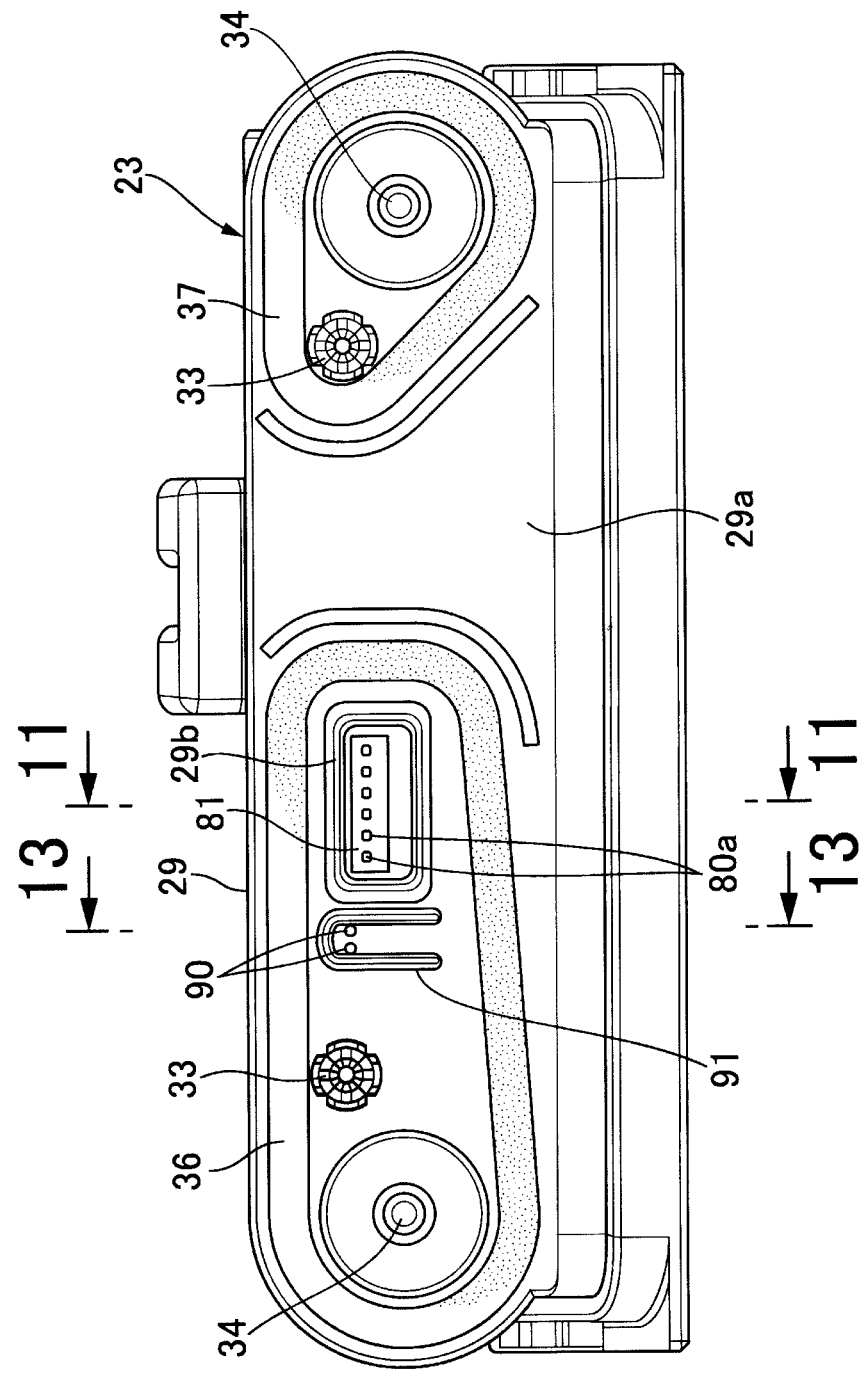
FIG. 7 is a view in the direction of arrow 7 in FIG. 6.

Referring in addition to FIG. 7, the first case member 29 is provided with a pair of first positioning pins 33 that protrude from the mounting plate portion 29a at positions spaced in the vehicle width direction, and a pair of bolts 34 protruding from the mounting plate portion 29a so as to be disposed outside the first positioning pins 33 in the vehicle width direction are mold bonded to the first case member 29. Formed integrally with the mounting plate portion 29a of the first case member 29 is a connector portion 29b protruding toward the inside of the vehicle in an intermediate part between the pair of first positioning pins 33.

The first positioning pin 33, the bolt 34, and the connector portion 29b extend through the outer panel 16, and screwing a nut 35 (see FIG. 2) around the bolt 34 extending through the outer panel 16 from the inside of the outer panel 16 mounts the first case member 29, that is, the case 23, on the outer panel 16.

A second seal member 36 that is endlessly continuous while surrounding one of the pair of first positioning pins 33, one of the pair of bolts 34, and the connector portion 29b and a third seal member 37 that is endlessly continuous while surrounding the other of the pair of first positioning pins 33 and the other of the pair of bolts 34 are disposed between the mounting plate portion 29a and the outer panel 16.

Mounted on the second case member 30 is an outer peripheral edge of a cover member 39 formed from an elastic material, for example, rubber so as to have a shape corresponding to the first recess part 31 of the second case member 30 while having a second recess part 38 disposed within the first recess part 31. The opening 32 is closed by the cover member 39.

Figure 8:
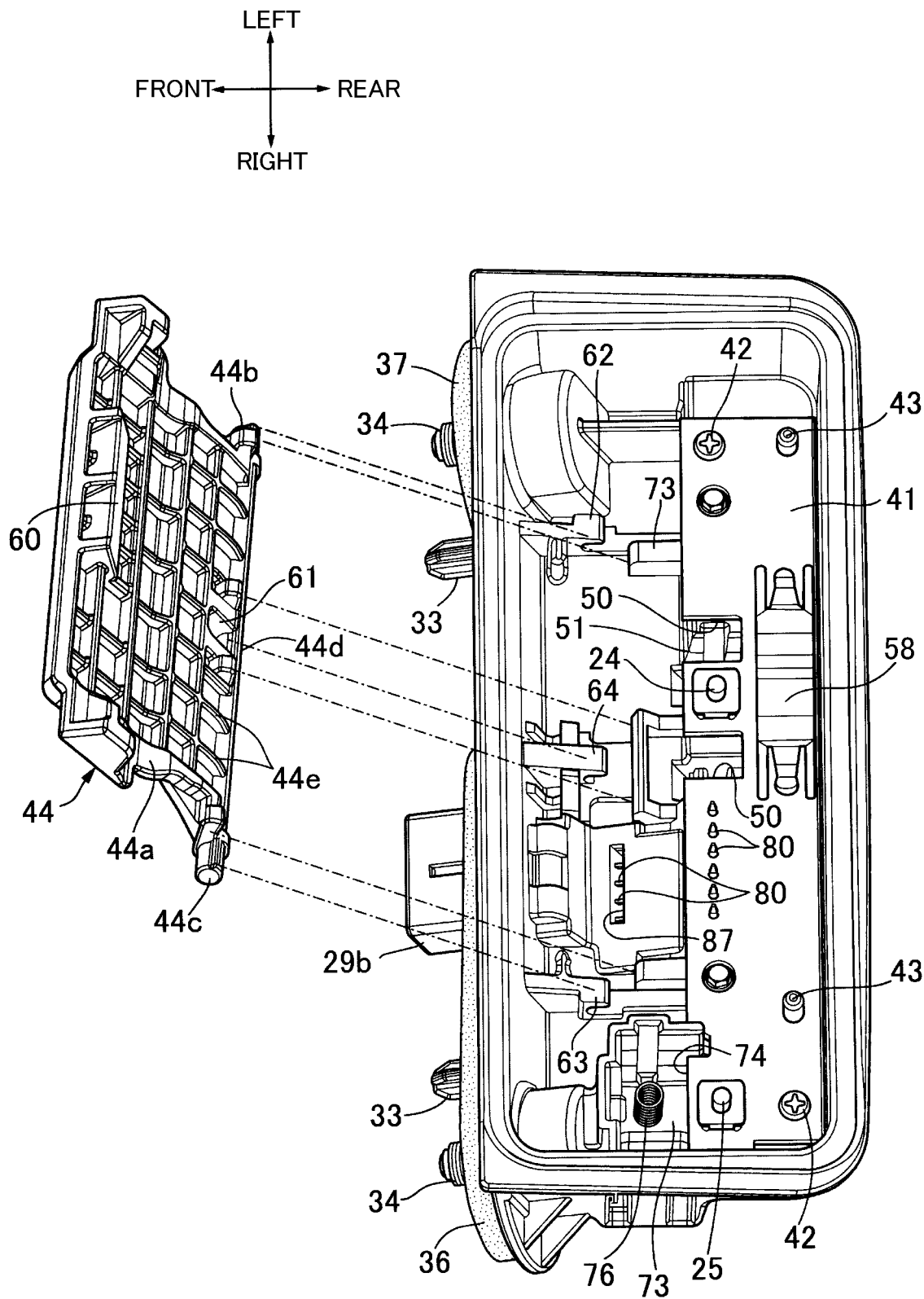
FIG. 8 is an exploded perspective view of a first case member and the push-button from below.

Referring in addition to FIG. 8, the case 23 has in its interior a housing chamber 40 communicating with the opening 32, and a circuit substrate 41 that extends substantially horizontally lengthwise in the vehicle width direction and is housed in the housing chamber 40 is fixedly disposed on the side opposite to the connector portion 29b of the first case member 29. That is, fastened to the first case member 29 by means of a plurality of, for example, a pair of screw members 42 is the circuit substrate 41, which is positioned by a pair of second positioning pins 43 projectingly provided integrally with the first case member 29.

The first switch 24 and the second switch 25 are disposed on a lower face of the circuit substrate 41 while being housed in the housing chamber 40. Moreover, the first switch 24 is disposed in a substantially middle part of the circuit substrate 41 in the vehicle width direction, and the second switch 25 is disposed on a right-hand end part of the circuit substrate 41 in the vehicle width direction.

Figure 6:
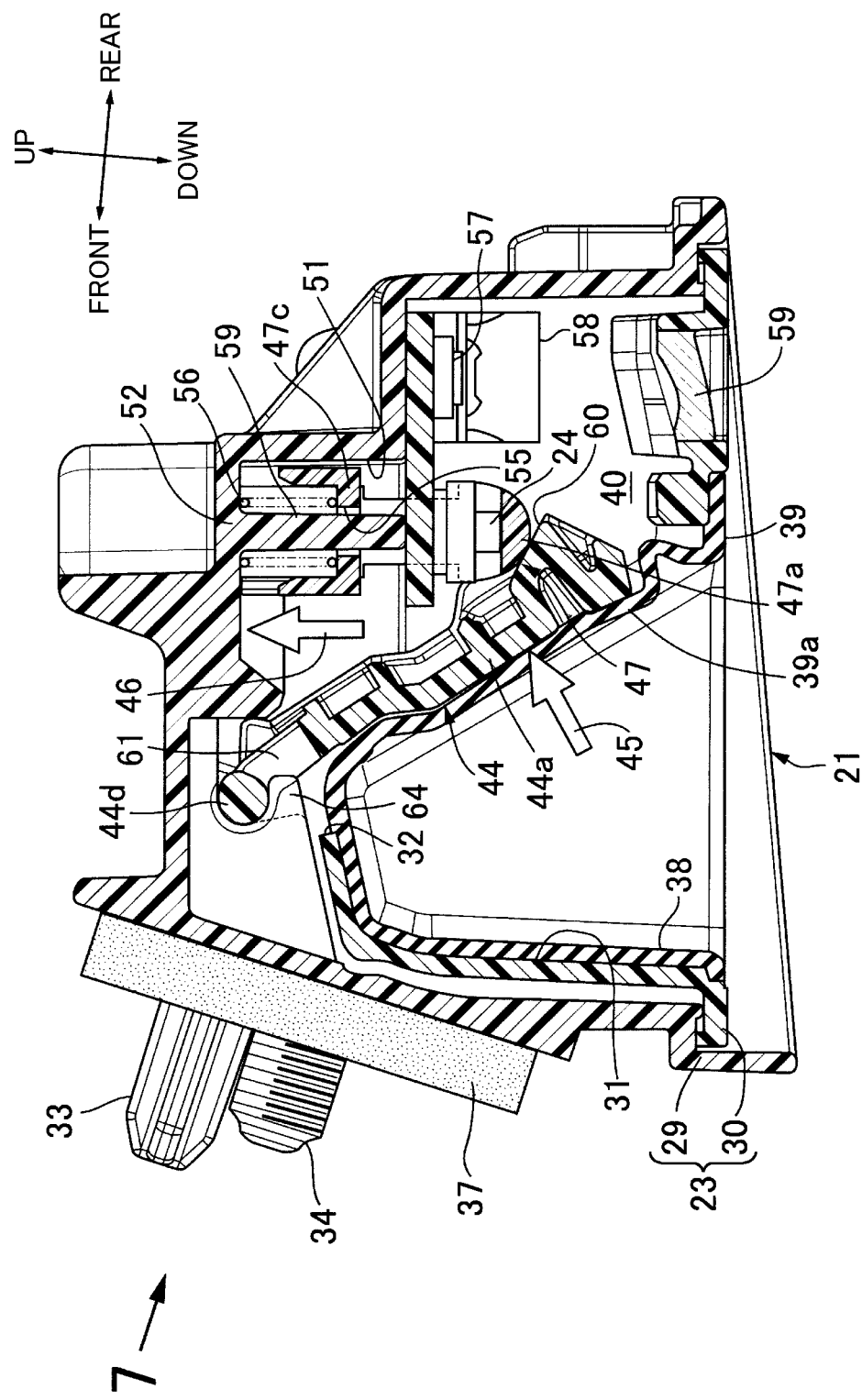
FIG. 6 is a longitudinal sectional view, corresponding to FIG. 2, of a vehicular push-button device in a state in which a push-button is pushed.

The case 23 supports a push-button 44 that can be pushed in order to switch the first switch 24, and the direction of pushing of the push-button 44 is obliquely upward to the rear as shown by arrow 45 in FIG. 6. On the other hand, since the first switch 24 is disposed on a substantially horizontal lower face of the circuit substrate 41, the direction of switching of the first switch 24 is substantially upward as shown by arrow 46 in FIG. 6. That is, the first switch 24 is disposed on the circuit substrate 41 while making the switching direction 46 different from the pushing direction 45 for the push-button 44.

Disposed between the push-button 44 and the first switch 24 is a pushing direction-conversion member 47 that operates in response to the push-button 44 being pushed, thus pushing the first switch 24 in the switching direction 46.

The pushing direction-conversion member 47 is formed from a synthetic resin while integrally having a pressure-receiving portion 47a that extends in the vehicle width direction and straddles the first switch 24 from the side opposite to the circuit substrate 41, a pair of first leg portions 47b that are connected to the vicinity of opposite ends in the longitudinal direction of the pressure-receiving portion 47a at right angles and extends upward while extending through the circuit substrate 41, and a bridging portion 47c that provides a connection between the pair of first leg portions 47b above the circuit substrate 41.

The pressure-receiving portion 47a on an end part, on the push-button 44 side, of the pushing direction-conversion member 47 receives a pressing force from the push-button 44, and is formed into an arc-shaped vertical longitudinal-sectional shape on the push-button 44 side.

Formed in the circuit substrate 41 are a pair of cutout parts 50 disposed on opposite sides in the vehicle width direction of the first switch 24. The pair of the first leg portions 47b of the pushing direction-conversion member 47 are disposed so as to extend through the cutout parts 50.

The pair of first leg portions 47b of the pushing direction-conversion member 47 are fitted into a first slide recess part 51 provided in the first case member 29 so that they can slide in the switching direction 46 while maintaining a constant relative position of the pushing direction-conversion member 47 with respect to the first switch 24 in a direction orthogonal to the switching direction 46.

The first case member 29 is provided with a first spring receiving part 52 that protrudes from the blocked end of the first slide recess part 51 so as to be disposed between the pair of first leg portions 47b of the pushing direction-conversion member 47, and a rod-shaped first spring guide 53 that protrudes from a central part of the first spring receiving part 52. On the other hand, the bridging portion 47c of the pushing direction-conversion member 47 is provided with a third recess part 54 opening toward the first spring receiving part 52 side, and a through hole 55 that communicates with a central part of the third recess part 54 so as to make the first spring guide 53 be inserted therethrough. The first spring guide 53 is inserted through the third recess part 54 and the through hole 55, and the extremity of the first spring guide 53 is abutted against an upper face of the circuit substrate 41.

Provided between the bridging portion 47c of the pushing direction-conversion member 47 and the first spring receiving part 52 of the first case member 29 of the case 23 is a first coil spring 56 urging the pushing direction-conversion member 47 toward the side opposite to the switching direction 46.

An LED 57 is mounted on the circuit substrate 41 to the rear of the second switch 24 in the vehicle fore-and-aft direction, and an inner lens 58 covering the LED 57 is mounted on the circuit substrate 41. Two locations adjacent to each other of a portion, corresponding to the inner lens 58, of the second case member 30 of the case 23 are formed as an outer lens 59 that shines light toward the license plate 18.

Figure 9:
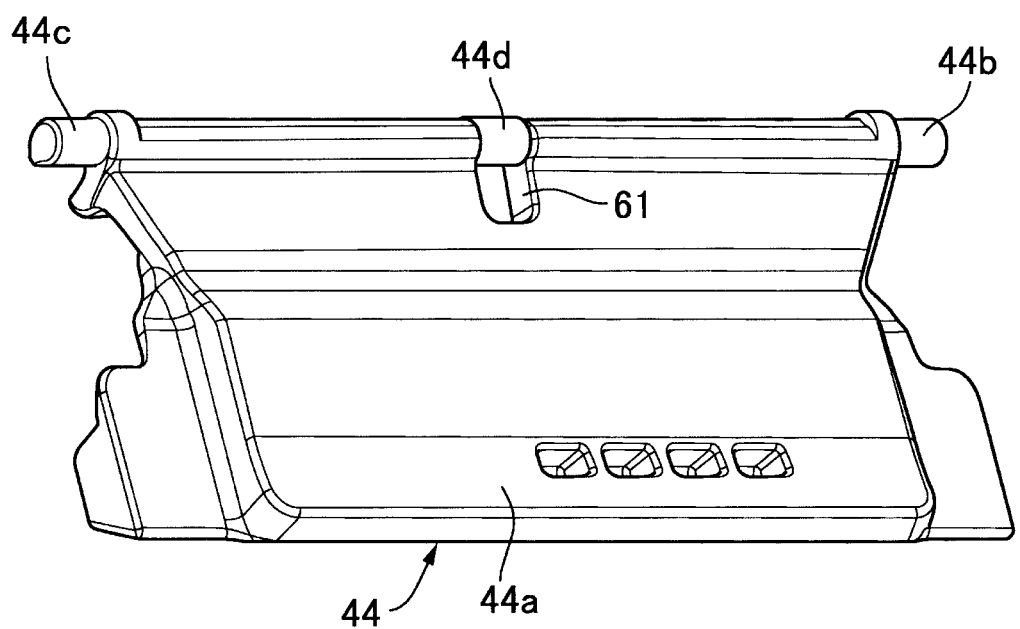
FIG. 9 is a perspective view of the push-button.

Referring in addition to FIG. 9, the push-button 44 is formed so as to integrally have a push-button main portion 44a that is formed into a substantially rectangular shape so as to be disposed in the opening 32 of the case 23, a first shaft portion 44b that protrudes from a left-hand end part in the vehicle width direction of an upper part of the push-button main portion 44a, a second shaft portion 44c that protrudes from a right-hand end part in the vehicle width direction of the upper part of the push-button main part 44a, and a third shaft portion 44d that is disposed in a middle part in the vehicle width direction of the upper part of the push-button main part 44a.

A flat pressing face 60 is formed on a face, on the housing chamber 40 side, of the push-button main portion 44a so as to be disposed on a middle part in the vehicle width direction close to a lower end part of the push-button main portion 44a, and a plurality of reinforcing ribs 44e are formed integrally with the face of the push-button main portion 44a so as to intersect each other.

Formed on the second recess part 38 of the cover member 39 is a first pushing operation portion 39a that bulges outward so as to have part of the push-button main portion 44a fitted thereinto from the housing chamber 40 side. The pressing face 60 of the push-button 44 abuts against the pressure-receiving portion 47a of the pushing direction-conversion member 47, and the push-button main portion 44a of the push-button 44 is clamped between the cover member 39 and the pushing direction-conversion member 47 urged by the first coil spring 56.

The first shaft portion 44b, the second shaft portion 44c, and the third shaft portion 44d are formed so as to have a coaxial circular section, and a through hole 61 that faces a lower part of the third shaft portion 44d is formed in the push-button main portion 44a.

Provided on an upper part of the first case member 29 are first, second, and third shaft support parts 62, 63, 64 pivotably supporting the first to third shaft portions 44b, 44c, 44d of the push-button 44. The shaft support parts 62 to 64 are formed so as to have a substantially C-shaped cross-sectional shape opening rearward in the vehicle fore-and-aft direction, and part of the third shaft support part 64 is inserted through the through hole 61.

Formed on the cover member 39 further on the right-hand side in the vehicle width direction than the second recess part 38 is a second pushing operation portion 39b that bulges outward while having an elliptical shape that is long in the vehicle fore-and-aft direction. A slider 71 is slidably supported on the first case member 29, the slider 71 sliding in response to a pushing force being applied to the second pushing operation portion 39b and switching the second switch 25.

Figure 10:
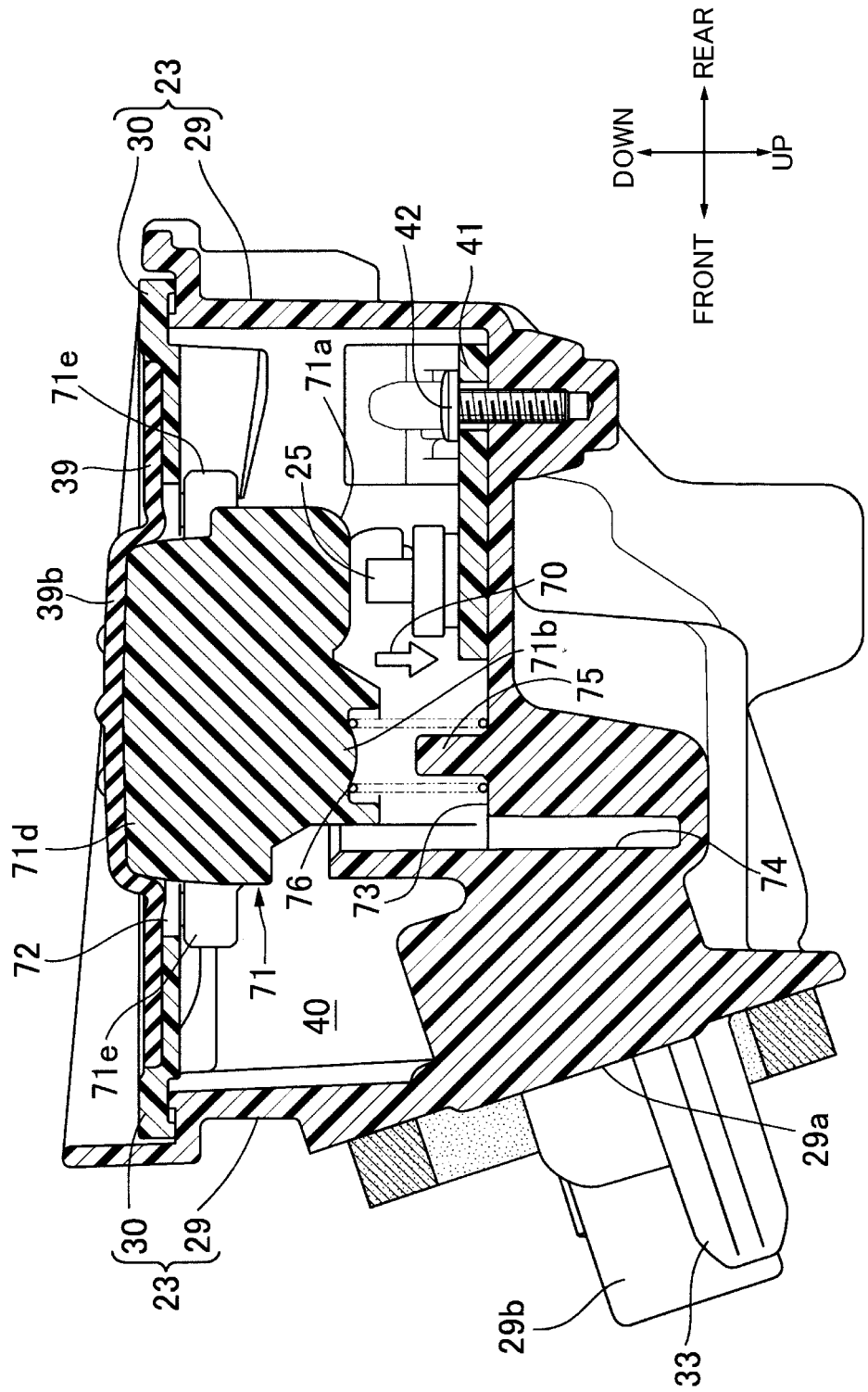
FIG. 10 is a sectional view along line 10-10 in FIG. 3.

Referring in addition to FIG. 10, the slider 71 is formed from a synthetic resin so as to integrally have a switch pressing portion 71a that opposes the second switch 25 from below so that it can push the second switch 25, a spring force-acting portion 71b that is connectedly provided on a front part in the vehicle fore-and-aft direction of the switch pressing portion 71a while being formed so as to extend lengthwise in the vehicle width direction and protrude out of the circuit substrate 41, a pair of second leg portions 71c that are connected at right angles to the vicinity of opposite ends in the longitudinal direction of the spring force-acting portion 71b and extend upward while extending through the circuit substrate 41, a pressure-receiving portion 71d that is connected to the switch pressing portion 71a and the spring force-acting portion 71b while having an elliptical shape that is long in the vehicle fore-and-aft direction, and an abutment arm portion 71e that protrudes laterally from four positions spaced in the peripheral direction of the pressure-receiving portion 71d.

Formed in the second case member 30 is a through hole 72 corresponding to the second pushing operation portion 39b. The pressure-receiving portion 71d is fitted into the second pushing operation portion 39b from the housing chamber 40 side while part thereof is inserted into the through hole 72, and the abutment arm portion 71e abuts against the second case member 30 around the through hole 82 from the housing chamber 40 side.

The pair of second leg portions 71c of the slider 71 are fitted into a second slide recess part 74 provided in the first case member 29, the second leg portions 71c being capable of sliding in a switching direction 70 of the second switch 25 while maintaining a constant relative position of the slider 71 with respect to the second switch 25 in a direction orthogonal to the switching direction 70.

The first case member 29 is provided with a second spring receiving part 73 that bulges from a blocked end of the second slide recess part 74 at a position corresponding to the spring force-acting portion 71b of the slider 71, and a rod-shaped second spring guide 75 that protrudes from the second spring receiving part 73. Provided between the second spring receiving part 73 and the spring force-acting portion 71b is a second coil spring 76 urging the slider 71 toward the side opposite to the switching direction 70 of the second switch 25. The second coil spring 76 is disposed so as to surround the second spring guide 75.

Figure 11:
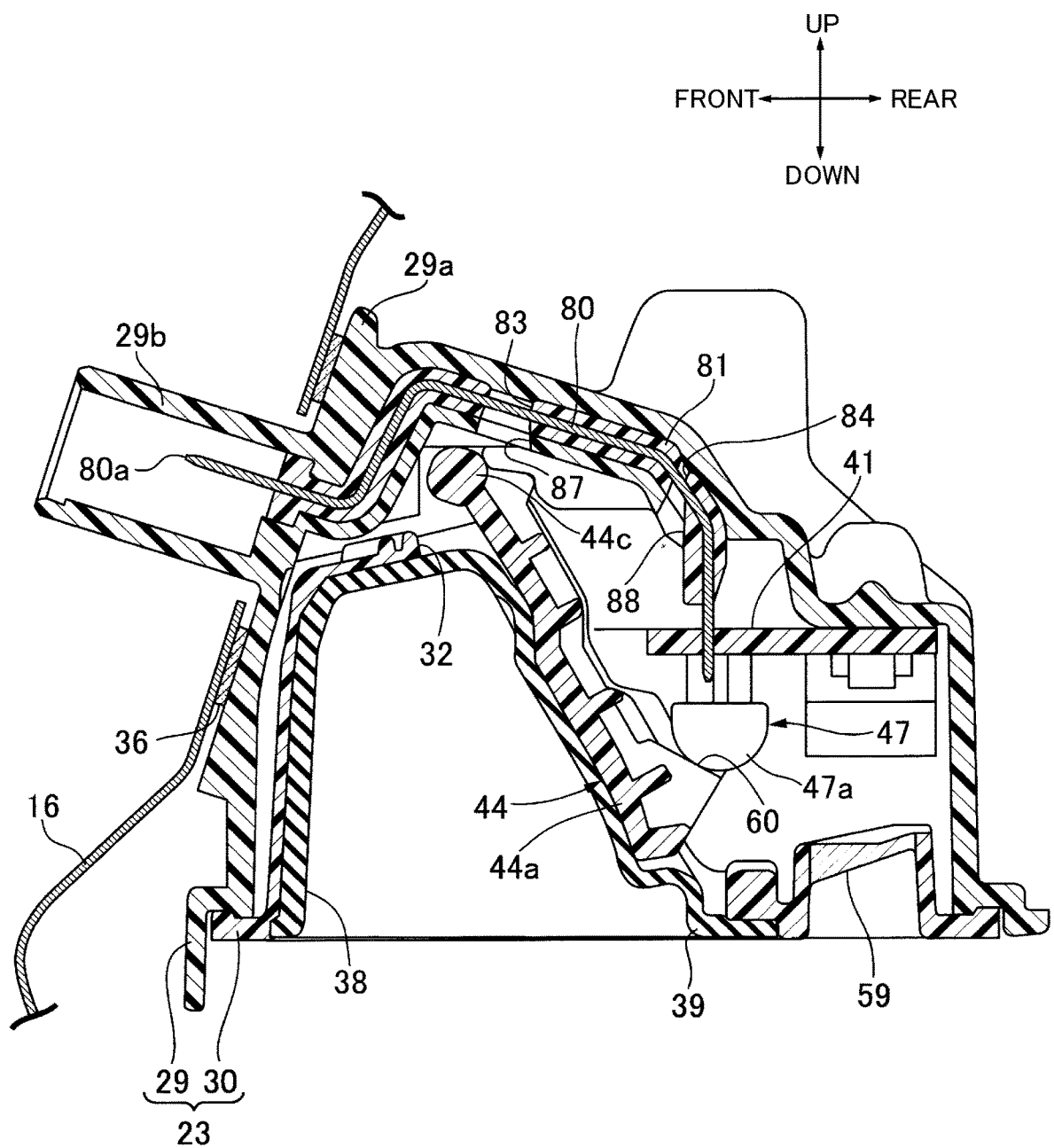
FIG. 11 is a sectional view along line 11-11 in FIG. 7.

In FIG. 11, one end part of a plurality of, for example, six terminal members 80 is inserted through and connected to the circuit substrate 41, and a connection terminal portion 80a formed on the other end part of the terminal members 80 is disposed within the connector portion 29b of the first case member 29 forming part of the case 23.

Figure 12A:
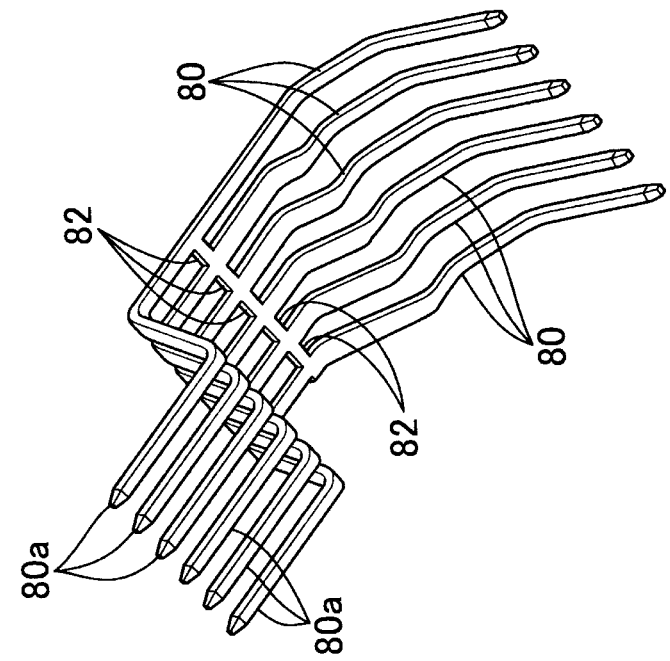
FIG. 12A is a perspective view of a terminal member prior to being insert bonded to a holder.
Figure 12B:
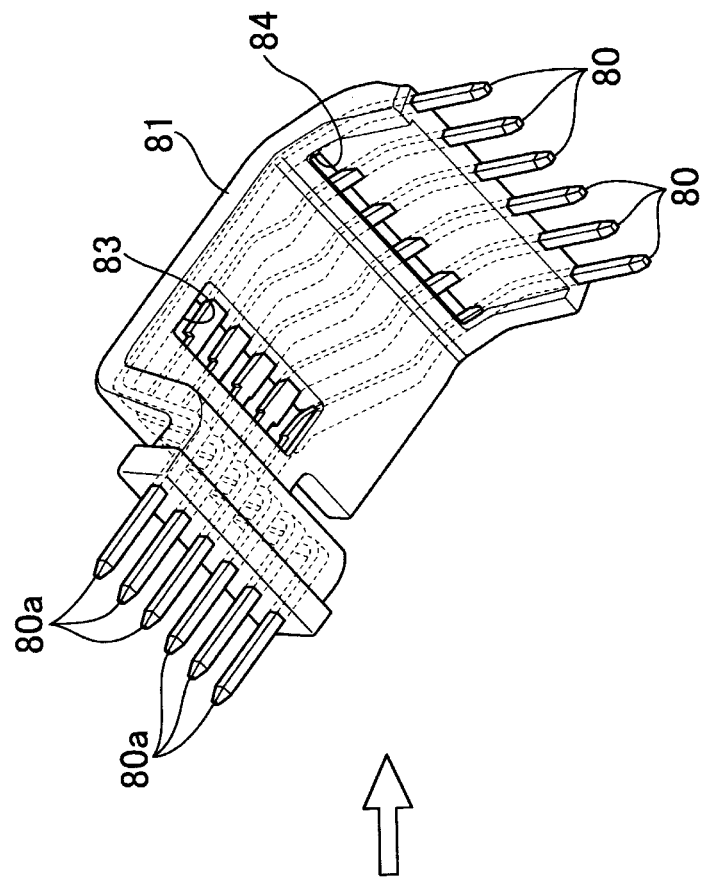
FIG. 12B is a perspective view of the terminal member after being insert bonded to the holder.

Referring in addition to FIGS. 12A and 12B, the plurality of connection terminals 80 are insert bonded to a resin holder 81, and the holder 81 is insert bonded to the first case member 29 while disposing the connection terminal portion 80a within the connector portion 29b.

The terminal member 80 is formed into a bent shape so as to correspond to the shape of a portion of the first case member 29 on which the terminal member 80 is disposed, and in a state prior to being insert bonded to the holder 81, as shown in FIG. 12A the terminal members 80 are linked to each other by means of a linking part 82 in order to maintain a constant relative position between the connection terminals 80.

As shown in FIG. 12B, the terminal member 80 is insert bonded to the holder 81, and the holder 81 has formed therein a first exposure hole 83 for punching out and a second exposure hole 84 for fixing a terminal member. The first exposure hole 83 is for punching out the linking part 82, which links the plurality of terminal members 80 to each other, in order to release the link between them, and the second exposure hole 84 is for preventing the terminal member 80 from being deformed when it is insert molded with the holder 81. That is, the first and second exposure holes 83, 84 are formed in the holder 81 at positions via which parts, excluding opposite end parts, of the terminal member 80 are exposed.

Moreover, as is clearly shown in FIG. 11 the holder 81 is insert bonded to the first case member 29 while leaving the first and second exposure holes 83, 84 as cavities, and first and second open holes 87, 88 opening toward the housing chamber 40 side within the case 23 and individually communicating with the first and second exposure holes 83, 84 are formed in the first case member 29.

Figure 13:
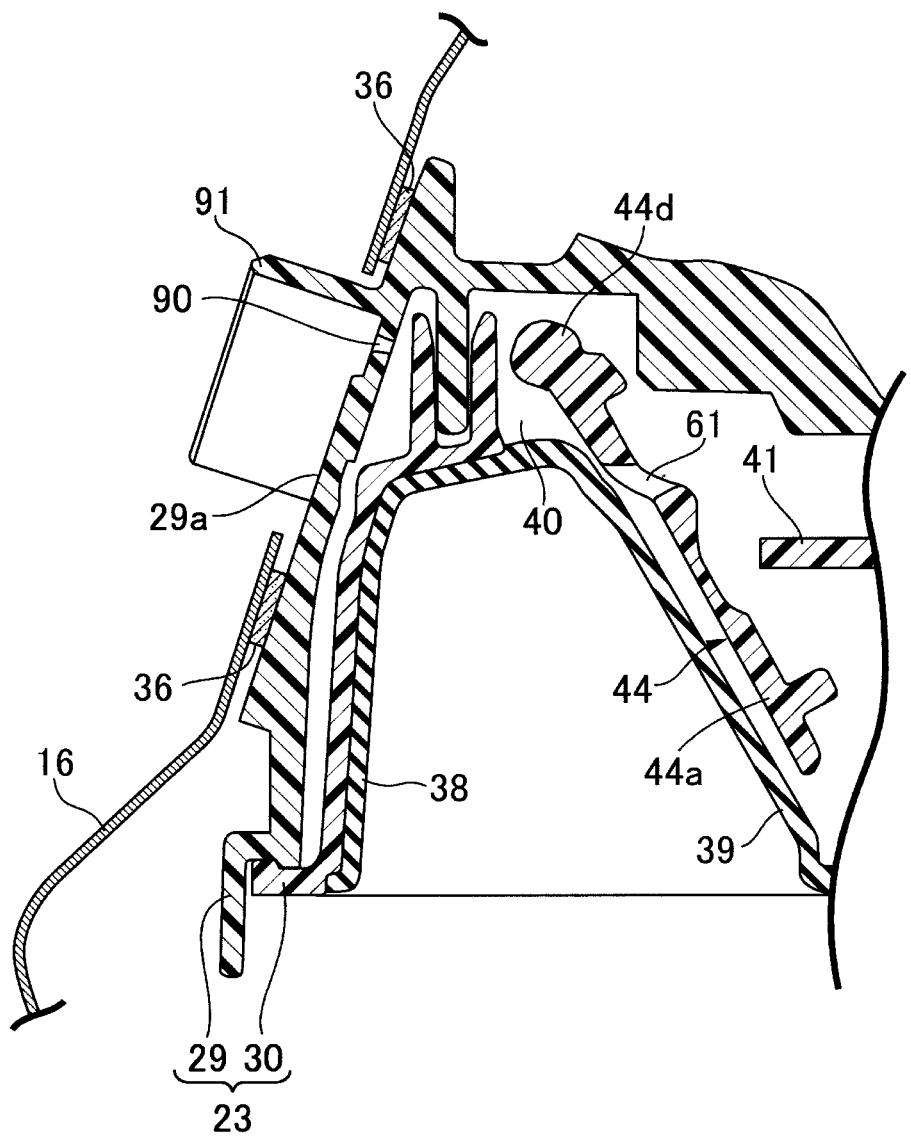
FIG. 13 is a sectional view along line 13-13 in FIG. 7.

Referring in addition to FIG. 13, formed in the first case member 29 is for example a pair of communication holes 90 for providing communication between the housing chamber 40 and the outside of the first case member 29.

The communication hole 90 is formed in a portion, surrounded by the second seal member 36, of the mounting plate portion 29a of the first case member 29, and in this embodiment the communication holes 90 are formed in the mounting plate portion 29a so as to be disposed side by side in the left-and-right direction between the connector portion 29b and the first positioning pin 33.

Moreover, projectingly provided integrally with an outer face of the mounting plate portion 29a is a canopy part 91 that has a substantially U-shape opening downward while covering the pair of communication holes 90 from above and from the side.

The operation of this embodiment is now explained. The plurality (six in this embodiment) of terminal members 80, which have one end part connected to the circuit substrate 41 housed in the housing chamber 40 within the case 23 and fixed to the case 23, are insert bonded to the resin holder 81 having the first and second exposure holes 83, 84, via which part of the terminal member 80 is exposed. The holder 81 is insert bonded to the first case member 29 while disposing the connection terminal portion 80a, which is on the other end part of the connection terminal 80, in the connector portion 29b formed integrally with the resin first case member 29 forming part of the case 23 and protruding to the inside of the vehicle. The holder 81 is insert bonded to the first case member 29 while leaving the first and second exposure holes 83, 84 as cavities, and the first and second open holes 87, 88 communicating with the first and second exposure holes 83, 84 and opening toward the housing chamber 40 side are formed in the first case member 29.

The first and second exposure holes 83, 84 of the holder 81 therefore remain as cavities after the holder 81 is insert bonded to the first case member 29, and no border occurs in a portion corresponding to the inside faces of the first and second exposure holes 83, 84 between a primary molding resin forming the holder 81 and a secondary molding resin forming the first case member 29. Because of this, even if moisture in the air enters a gap between the terminal member 80 and the primary molding resin from the connector portion 29b, no short circuit is caused by the moisture between the terminal members 80 in the portions of the first and second exposure holes 83, 84.

Furthermore, since the first and second exposure holes 83, 84 are formed in the holder 81 at positions via which part of the terminal member 80, excluding opposite end parts, are exposed, it is possible to decrease as much as possible the area of the first and second exposure holes 83, 84 formed in the holder 81, thus minimizing a portion, which forms the first and second exposure holes 83, 84, of a mold forming the holder 81 and thereby reducing the cost of the mold.

Moreover, since the communication hole 90 providing communication between the housing chamber 40 and the outside of the first case member 29 is formed in the first case member 29, it is possible for the communication hole 90 to prevent any difference from occurring between the pressure of the outside of the first case member 29 and the pressure within the housing chamber 40. Because of this, even if moisture in the air enters the first and second exposure holes 83, 84 side from the connector portion 29b through the gap between the terminal member 80 and the primary molding resin, it is possible to suppress moisture being sucked toward the housing chamber 40 side. That is, if the interior of the housing chamber 40 were a space independent from the outside, due to the pressure within the housing chamber 40 becoming lower when the temperature is low, moisture entering the first and second exposure holes 83, 84 would be sucked into the housing chamber 40 and could drip down, but due to the communication hole 90 being formed in the first case member 29 such an event can be avoided.

An embodiment of the present invention is explained above, but the present invention is not limited to the above-mentioned embodiment and may be modified in a variety of ways as long as the modifications do not depart from the gist of the present invention.

For example, in the above embodiment, explanation is given by illustrating the vehicular push-button device 21 as a structure for connecting a terminal to a circuit substrate within a case, but the present invention can be applied widely to an arrangement in which a holder having insert bonded thereto a plurality of terminal members provided between a connector part and a circuit substrate and also having an exposure hole via which part of the terminal member is exposed is insert bonded to a case member that forms part of a case having a housing chamber housing the circuit substrate and integrally has the connector part.

What is claimed is:

1. A structure for connecting a terminal to a circuit substrate, comprising:
   a case;
   a housing chamber formed within the case having a resin case member and integrally having a connector portion;
   a plurality of terminal members each having one end part connected to the circuit substrate housed in the housing chamber; and
   a resin holder insert bonding the plurality of terminal members therein, the resin holder extending continuously from the one end part of the plurality of terminal members to another end part of the plurality of terminal members, and having an exposure hole formed therein through which part of each of the terminal members is exposed, is the resin holder being insert bonded to the case member with the another end part of the terminal member being disposed within the connector portion,
   wherein the holder is insert bonded to the case member while leaving the exposure hole as a cavity, and the case member has an open hole formed therein, the open hole communicating with the exposure hole and opening on the housing chamber side, and
   the open hole and the exposure hole align with each other at a position where the terminal members and the case are exposed to view from the housing chamber side through the open hole and the exposure hole.

2. The structure for connecting a terminal to a circuit substrate within a case according to claim 1, wherein the exposure hole is formed in the holder at a position where a portion, other than opposite end parts, of the terminal member faces the exposure hole.

3. The structure for connecting a terminal to a circuit substrate within a case according to claim 1, wherein a communication hole is formed in the case member, the communication hole providing communication between the housing chamber and an outside of the case member.

4. The structure for connecting a terminal to a circuit substrate within a case according to claim 2, wherein a communication hole is formed in the case member, the communication hole providing communication between the housing chamber and an outside of the case member.

5. The structure for connecting a terminal to a circuit substrate within a case according to claim 1, wherein
   a shape of the exposure hole matches a shape of the open hole at a position where the exposure hole abuts and aligns with the open hole, and
   the abutment and alignment of the exposure hole and the open hole occurs without a border between an inside face of the exposure hole and the case member.

* * * * *